United States Patent
Tsuchida et al.

(10) Patent No.: US 6,835,294 B2
(45) Date of Patent: Dec. 28, 2004

(54) ELECTROLYTIC COPPER PLATING METHOD

(75) Inventors: Hideki Tsuchida, Hasuda (JP); Masaru Kusaka, Saitama (JP); Shinjiro Hayashi, Saitama (JP)

(73) Assignee: Shipley Company, L.L.C., Marlborough, MA (US)

( * ) Notice: Subject to any disclaimer, the term of this patent is extended or adjusted under 35 U.S.C. 154(b) by 294 days.

(21) Appl. No.: 10/165,437

(22) Filed: Jun. 7, 2002

(65) Prior Publication Data

US 2003/0015433 A1 Jan. 23, 2003

(30) Foreign Application Priority Data

Jun. 7, 2001 (JP) ........................................ 2001-172312

(51) Int. Cl.$^7$ ........................ C25D 21/06; C25D 21/18; C25D 3/38; C25D 5/02; H01L 21/288
(52) U.S. Cl. ........................ 205/98; 205/101; 205/291; 205/292; 205/296; 205/118; 205/123; 205/125; 205/102; 205/103
(58) Field of Search ........................ 205/98, 101, 291, 205/292, 296, 118, 123, 125, 102, 103

(56) References Cited

U.S. PATENT DOCUMENTS 4,933,051 A * 6/1990 Kline ........................ 205/295
6,391,179 B1 5/2002 Ogawa ........................ 205/98
2003/0094376 A1 * 5/2003 Seita et al. .................. 205/291
2003/0183526 A1 10/2003 Kusaka et al. .............. 205/118
2004/0089557 A1 5/2004 Tsuchida et al. ............ 205/291

FOREIGN PATENT DOCUMENTS

| DE | 195 39 865 | 4/1997 | |
| DE | 19539865 A1 * | 4/1997 | ............ C25D/5/18 |
| GB | 2 133 040 | 7/1984 | |
| JP | 7-336017 | 12/1995 | |

OTHER PUBLICATIONS

Patent Abstracts of Japan, vol. 017, No. 091 (E–1324), Feb. 23, 1993 & JP 04 284691 A (Arumetsukusu:KK; Others: 01), Oct. 9, 1992.

Patent Abstracts of Japan, vol. 2000, No. 06, Sep. 22, 2000 & JP 2000 068651 A (Nippon Riironaaru KK), Mar. 3, 2000.

* cited by examiner

*Primary Examiner*—Edna Wong
(74) *Attorney, Agent, or Firm*—S. Matthew Cairns

(57) ABSTRACT

Electrolytic copper plating methods are provided, wherein copper is electrolytically deposited on a substrate, and the electrolytic copper plating solution supplied to the electrolytic copper plating is subjected to dummy electrolysis using an insoluble anode. The method described above can maintain and restore the electrolytic copper plating solution so as to maintain satisfactory appearance of plated copper, fineness of deposited copper film, and via-filling.

10 Claims, 4 Drawing Sheets no dummy electrolysis soluble anode, 60 min dummy electrolysis insoluble anode, 5 min dummy electrolysis soluble anode, 10 min dummy electrolysis insoluble anode, 15 min dummy electrolysis soluble anode, 20 min dummy electrolysis no dummy electrolysis soluble anode, 60 min dummy electrolysis insoluble anode, 5 min dummy electrolysis soluble anode, 10 min dummy electrolysis insoluble anode, 15 min dummy electrolysis soluble anode, 20 min dummy electrolysis MPS concentration: 0 μg/L MPS concentration: 10 μg/L MPS concentration: 50 μg/L MPS concentration: 100 μg/L MPS concentration: 500 μg/L MPS concentration: 1000 μg/L

| No. | Plating Conditions | Section |
|---|---|---|
| 1 | MPS not added<br>new bath |  |
| 2 | MPS: 1000 µg/L<br>no dummy electrolysis |  |
| 3 | MPS: 1000 µg/L<br>dummy electrolysis: 1.33 Ahr/L<br>soluble anode |  |
| 4 | MPS: 1000 µg/L<br>dummy electrolysis: 2.7 Ahr/L<br>soluble anode |  |
| 5 | MPS: 1000 µg/L<br>dummy electrolysis: 0.22 Ahr/L<br>insoluble anode |  |

| Amount of Electrolysis in Main Bath | No Dummy electrolysis | With Dummy electrolysis |
|---|---|---|
| 0 Ahr/L (new bath) |  |  |
| 30 Ahr/L |  |  |
| 50 Ahr/L |  |  |
| 100 Ahr/L |  |  |

ELECTROLYTIC COPPER PLATING METHOD

BACKGROUND OF THE INVENTION

This invention pertains to an electrolytic copper plating method. More particularly, this invention pertains to an electrolytic copper plating method that does not mar the appearance of plating and is applied to form filled via-holes.

There is a strong demand in the industry for making printed circuit boards thinner and higher-density to achieve high-performance, miniaturized electronic devices, beginning with personal computers. One approach to such demands is to use a multilayer printed circuit board produced using the build-up technique of forming a pattern on each layer and laminating layers in succession (build-up printed circuit board).

In recent years, a method called "via-filling" has been developed for filling the entire via-hole (or "via") in this type of build-up printed circuit board with a conductor and electrically connecting adjacent build-up printed circuit boards. This method is effective for miniaturizing and increasing the density of printed circuit boards by enabling the effective surface area of printed circuit boards to be increased, and obtaining an adequate electrical connection even for small-diameter vias compared to plating only the via inner wall by the prior art method.

Published via-filling methods include a method for filling vias with conductive paste by the printing method, a method for activating only the conductive layer on the via floor and accumulating electroless copper plating layers, and a method using electrolytic copper plating.

Because it is a mixture of copper and an organic substance, however, conductive paste has lower conductivity than metallic copper, making it difficult to achieve an adequate electrical connection in a small-diameter via, and this cannot be considered an effective method for miniaturizing and increasing the density of printed circuit boards. Furthermore, filling by the printing method requires filling a small-diameter, non-communicating hole with a viscous paste, and the viscosity of the paste makes it difficult to fill this completely leaving no air voids. The method using electroless copper plating is superior to the conductive paste method on the point that the via filling substance is a highly-conductive metallic copper deposit, but has the productivity problem that the plating speed of the deposit is slow. The plating speed of the deposit using a general high-speed electroless copper plating bath is about 3 $\mu$m/hr, but when used to fill a typical blind via measuring 100 $\mu$m in diameter and 100 $\mu$m deep with copper plating, this takes 30 hours or longer and has extremely poor productivity.

By contrast, electrolytic copper plating has a fast plating speed of 10 to 50 $\mu$m/hr, and can greatly shorten time compared to electroless copper plating. As a result, application of electrolytic copper plating to vias is anticipated. However, to fill vias adequately leaving no air voids when plating copper over the entire via inner wall, the plating speed near the floor inside via must be faster than the plating speed at the opening. If the plating speed near the floor is the same or slower than the plating speed at the opening, the via is not adequately filled, or the opening becomes clogged before the filling of the via with plated copper has finished, leaving air inside. Either case is untenable in practice. Therefore, to adequately fill vias, plating conditions must be adjusted carefully such that metal can plate appropriately.

Normally, electrolytic copper plating solutions containing specific sulfated compounds, starting with brighteners, are used for production of printed circuit boards, and generally, electrolysis conditions are direct-current electrolysis using soluble anodes such as phosphated copper anodes. However, plating by a soluble anode has problems such as that the electrolytic copper plating bath is unstable during electrolysis and after stopping electrolysis, and when used thereafter, the electrolytic copper plating solution produces clumps during formation of electrolytic copper deposits, marring the appearance of the plating and destabilizing the via-filling.

In one method for improving via-filling, the method of electrolytic copper plating using an electrolytic copper plating solution containing specific sulfated compounds and a PPR (pulse periodic reverse) current disclosed by Japan Unexamined Patent Application No. 2000-68651 controls adsorption and desorption of the specific sulfated compounds to the substrate by using a PPR current, but does not solve the problems described above caused by using a soluble anode.

Another method for improving via-filling is the method of electrolytic copper plating using an insoluble anode. However, this method has the problem that all the anodes used are insoluble anodes, and because they are expensive, insoluble anodes raise overall system costs. Using insoluble anodes also requires replenishing basic copper carbonates and copper oxides consumed as the plating bath is used, and this leads to the problem that impurities such as chlorine, iron, or nickel contained in the replenished copper salts are mixed into the plating bath.

SUMMARY OF THE INVENTION

Reflecting on this situation, the purpose of this invention is to offer a method for the electrolytic deposition of copper on a substrate using an electrolytic copper plating solution, especially an electrolytic copper plating solution containing specific sulfated compounds, and subjecting the electrolytic copper plating solution to dummy electrolysis using an insoluble anode, whereby the electrolytic copper deposited by continuous electrolytic copper plating using said electrolytic copper plating solution forms a fine deposited film, and the plating has satisfactory appearance and satisfactory via-filling property.

This invention pertains to an electrolytic copper plating method wherein electrolytic copper plating is applied to a substrate, and the electrolytic copper plating solution supplied to said electrolytic copper plating is subjected to dummy electrolysis using an insoluble anode.

This invention also pertains to an electrolytic copper plating method wherein electrolytic copper plating is applied to a substrate using a soluble anode in an electrolytic copper plating bath holding an electrolytic copper plating solution and having said soluble anode or having said soluble anode and an insoluble anode, and after said plating, the electrolytic copper plating solution used in the above-mentioned electrolytic copper plating is subjected to dummy electrolysis using said insoluble anode.

Furthermore, this invention pertains to an electrolytic copper plating method wherein, in a multi-bath electrolytic copper plating apparatus comprised of a main bath having a soluble anode, a dummy electrolysis bath having an insoluble anode, and a circulation pipe connecting said main bath and said dummy electrolysis bath to allow circulation of an electrolytic copper plating solution, the above-mentioned electrolytic copper plating solution is stored in said main bath and said dummy electrolysis bath, and electrolytic copper plating is applied to a substrate in said main bath using said soluble anode, and the electrolytic copper plating solution is subjected to dummy electrolysis simultaneously in said dummy electrolysis bath using said insoluble anode while circulating the above-mentioned electrolytic copper plating solution between said main bath and said dummy electrolysis bath through said circulating pipe, or is subjected to dummy electrolysis in said dummy electrolysis bath using said insoluble anode after said plating.

Also provide by this invention is a method for plating copper comprising the steps of: contacting a substrate to be plated with a copper electroplating solution, applying a current density to the copper electroplating solution to deposit copper on the substrate, and subjecting the copper electroplating solution to dummy electrolysis using an insoluble anode.

In another aspect, this invention provides a method for plating copper comprising the steps of: electrolytically depositing copper on a substrate using a copper electroplating bath comprising a copper electroplating solution and a soluble anode; replacing the soluble anode with an insoluble anode after copper deposition; and subjecting the copper electroplating solution to dummy electrolysis using an insoluble anode.

In a further aspect, this invention provides a method for plating copper comprising the steps of: electrolytically depositing copper on a substrate using a copper plating bath comprising a copper electroplating solution, a soluble anode and an insoluble anode by applying current density to the soluble anode; and then subjecting the copper electroplating solution to dummy electrolysis using an insoluble anode.

Another embodiment of the invention is a method for plating copper comprising the steps of: providing a multi-bath copper electroplating apparatus comprising a main bath having a soluble anode, a dummy electrolysis bath having an insoluble anode, and a circulation pipe connecting the main bath and the dummy electrolysis bath, the circulation pipe allowing fluid communication between the main bath and the dummy electrolysis bath; providing a copper electroplating solution to the main bath and the dummy electrolysis bath; contacting a substrate to be plated with the copper electroplating solution in the main bath; applying current density to the soluble anode and to the insoluble anode while circulating the copper electroplating solution between the main bath and the dummy electrolysis bath through the circulation pipe.

This invention further provides a method for plating copper comprising the steps of: providing a multi-bath copper electroplating apparatus comprising a main bath having a soluble anode, a dummy electrolysis bath having an insoluble anode, and a circulation pipe connecting the main bath and the dummy electrolysis bath, the circulation pipe allowing fluid communication between the main bath and the dummy electrolysis bath; providing a copper electroplating solution to the main bath; contacting a substrate to be plated with the copper electroplating solution in the main bath; applying current density to the soluble anode to deposit copper on the substrate; the feeding the copper electroplating solution from the main bath to the dummy electrolysis bath using the circulation pipe; subjecting the copper electroplating solution to dummy electrolysis; and then feeding the copper electroplating solution from the dummy electrolysis bath to the main bath using the circulation pipe.

DETAILED DESCRIPTION OF THE INVENTION

Figure 1:
FIG. 1 are microscope section photographs of via-holes after electrolytic copper plating, showing restoration of via-holes filling by dummy electrolysis using direct current.
Figure 1:
Figure 1:
Figure 1:
Figure 1:
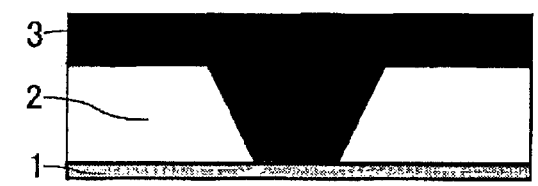
Figure 1:
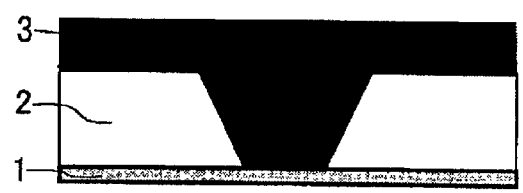

One mode of this invention is an electrolytic copper plating method wherein electrolytic copper plating is applied to a substrate, and the electrolytic copper plating solution supplied to said electrolytic copper plating is subjected to dummy electrolysis using an insoluble anode.

In this method, first, electrolytic copper plating is applied to a substrate. "Electrolytic copper plating" means plating in which the substrate to be subjected to electrolytic copper plating is electrolyzed in the presence of an anode in an electrolytic copper plating bath, and copper is deposited onto said substrate. The method of electrolytic copper plating applied in this invention can be any desired standard method without special restrictions.

The anode used in electrolytic copper plating may be an insoluble anode or a soluble anode. Generally, when applying electrolytically depositing copper on a substrate using a soluble anode, the plating bath often becomes unstable for the reasons explained below. Because the electrolytic copper plating method of this invention offers the effect of keeping the plating bath stable by subjecting said plating bath to dummy electrolysis, the effect of this invention is better achieved by using a soluble anode for electrolytic copper plating. Therefore, electrolytic copper plating a substrate using a soluble anode is preferred in this invention.

In the method of this invention, the electrolytic copper plating solution supplied to electrolytic copper plating is subjected to dummy electrolysis using an insoluble anode. "Electrolytic copper plating solution supplied to electrolytic copper plating" means that the electrolytic copper plating solution subjected to dummy electrolysis was already used for electrolytic copper plating. It does not matter whether this is a plating solution after completely finishing electrolytic copper plating or a plating solution at a stage midway in electrolytic copper plating. Preferably, "electrolytic copper plating solution supplied to electrolytic copper plating" means that the electrolytic copper plating solution subjected to dummy electrolysis was already used for electrolytic copper plating using an insoluble anode.

In this invention, "dummy electrolysis" means electrolyzing the plating bath using a cathode and an anode while the substrate, i.e. a printed wiring board, is not in the presence of the anode in the electrolytic copper plating bath. In such cases a "dummy" or substituted substrate is used as the cathode. "Substituted substrate" refers to any substrate that is not printed wiring board to be plated.

Another mode of this invention is an electrolytic copper plating method wherein copper is deposited electrolytically on a substrate using a soluble anode in an electrolytic copper plating bath holding a copper plating solution and having said soluble anode, the soluble anode is replaced by an insoluble anode after said deposition, and the copper plating solution is subjected to dummy electrolysis using said insoluble anode.

In this mode, an electrolytic copper plating bath having a soluble anode is used. Such an electrolytic copper plating bath can be any desired type so long as it has a soluble anode and can hold an electrolytic copper plating solution, and is not subject to any special restrictions such as size or shape so long as it offers the effects of this invention. In this mode, the soluble anode is replaced by an insoluble anode after electrolytic copper plating. "Replaced" here means that an insoluble anode is set to function as the anode in dummy electrolysis. The soluble anode may remain in the electrolytic copper plating solution so long as it does not function as the anode in dummy electrolysis, or it may be removed from the electrolytic copper plating solution.

Another mode of this invention is an electrolytic copper plating method wherein copper is electrolytically deposited on a substrate using a soluble anode in an electrolytic copper plating bath holding an electrolytic copper plating solution and having said soluble anode and an insoluble anode, and after said deposition, the electrolytic copper plating solution is subjected to dummy electrolysis using said insoluble anode.

In this mode, an electrolytic copper plating bath having a soluble anode and an insoluble anode is used. Such an electrolytic copper plating bath can be any desired type so long as it has a soluble anode and an insoluble anode and can hold an electrolytic copper plating solution, and is not subject to any special restrictions such as size or shape so long as it offers the effects of this invention. Because the bath has a soluble anode and an insoluble anode, this mode has the advantage that although electrolysis is switched from electrolytic copper plating, it can be switched simply by switching which anode is charged.

Another mode of this invention is an electrolytic copper plating method wherein in a multi-bath electrolytic copper plating apparatus comprised of a main bath having a soluble anode, a dummy electrolysis bath having an insoluble anode, and a circulation pipe connecting said main bath and said dummy electrolysis bath to allow circulation of an electrolytic copper plating solution, the electrolytic copper plating solution is stored in said main bath and said dummy electrolysis bath, and copper is deposited electrolytically on a substrate in said main bath using said soluble anode and dummy electrolysis is performed in said dummy electrolysis bath using said insoluble anode while circulating the electrolytic copper plating solution between said main bath and said dummy electrolysis bath through said circulating pipe.

This mode is characterized by using a multi-bath electrolytic copper plating apparatus. Said multi-bath electrolytic copper plating apparatus is comprised of a main bath having a soluble anode, a dummy electrolysis bath having an insoluble anode, and a circulation pipe connecting said main bath and said dummy electrolysis bath to allow circulation of the electrolytic copper plating solution. The main bath and the dummy electrolysis bath are not subject to any special restrictions such as size or shape so long as both hold the electrolytic copper plating solution and can electrolytically deposit copper in the former and dummy electrolysis in the latter. In addition, the circulating pipe can be any desired type so long as it can circulate electrolytic copper plating solution between the main bath and the dummy electrolysis bath. For example, said pipe can be a type having a pump mounted such that it can feed solution.

The main bath and the dummy electrolysis bath are connected by the circulating pipe, but are completely or substantially electrically insulated. Therefore, the main bath and the dummy electrolysis bath can be fitted with separate anodes for electrolytically depositing copper in the former and dummy electrolysis in the latter.

In addition, the multi-bath electrolytic copper plating apparatus of this invention must have at least one of each of a main bath and a dummy electrolysis bath, but the number of baths is not specially limited, and the apparatus may have more than one of each.

Because electrolytic copper plating solution is circulated between a main bath and a dummy electrolysis bath in this mode, electrolytic copper plating and dummy electrolysis can be performed simultaneously. For example, dummy electrolysis may be applied while interrupting or without interrupting electrolytic copper plating, and dummy electrolysis may be applied only intermittently as required while electrolytic copper plating is interrupted. The flow rate of electrolytic copper plating solution in the circulating pipe may be constant or varied as appropriate, and the electrolytic copper plating solution can be circulated intermittently.

Another mode of this invention is an electrolytic copper plating method wherein in a multi-bath electrolytic copper plating apparatus comprised of a main bath having a soluble anode, a dummy electrolysis bath having an insoluble anode, and a circulation pipe connecting said main bath and said dummy electrolysis bath to allow circulation of an electrolytic copper plating solution, the electrolytic copper plating solution is stored in said main bath, copper is electrolytically deposited on a substrate in said main bath using said soluble anode, then the electrolytic copper plating solution used in said deposition is fed to said dummy electrolysis bath through said circulating pipe, the electrolytic copper plating solution used in said deposition is subjected to dummy electrolysis in said dummy electrolysis bath using said insoluble anode and after said dummy electrolysis, the electrolytic copper plating solution is fed to said main bath through said circulating pipe.

This mode uses a multi-bath electrolytic copper plating apparatus such as described above, but is characterized by applying dummy electrolysis after electrolytic copper plating in the main bath. In this mode, dummy electrolysis may be performed while circulating solution between the main bath and the dummy electrolysis bath, or a batch system may be used in which feeding solution is stopped after feeding a set amount of electrolytic copper plating solution from the main bath to the dummy electrolysis bath, dummy electrolysis is performed in the dummy electrolysis bath, then electrolytic copper plating solution is returned to the main bath. In terms of ease of operation, it is preferable to perform dummy electrolysis while circulating the solution.

The electrolytic copper plating solution used in this invention can be any solution so long as it can plate copper electrolytically. Examples include solutions containing one or more of copper sulfate, copper cyanide, copper alkane sulfonate and copper pyrophosphate, but are not limited to these. Preferably, the electrolytic copper plating solution contains copper sulfate. The typical example of copper sulfate plating solution is given when explaining electrolytic copper plating below. Moreover, matters such as the composition and ingredients of other plating solutions can be decided easily by persons skilled in the art from the following description of a copper sulfate plating solution and from public sources.

Preferably, the electrolytic copper plating solution used in this invention contains a compound having the structure —X—S—Y—. Preferably, X and Y in the structure of the above-mentioned compound are atoms selected independently from a group consisting of hydrogen, carbon, nitrogen, sulfur, and oxygen. For convenience, the above-mentioned compounds are called "sulfated compounds" as used in this Specification. More preferably, X and Y are atoms selected independently from a group consisting of hydrogen, carbon, nitrogen, and sulfur. Even more preferably, X and Y are atoms selected independently from a group consisting of hydrogen, carbon, and sulfur, and X and Y can be the same only when both are carbon.

Moreover, the formula —X—S—Y— is given above showing S as having a valence of 2, but this does not mean that atoms Y and X have a valence of 2. Atoms X and Y can be bonded with any other desired atoms depending on their valency. For example, if X is hydrogen, this produces the structure H—S—Y—.

More preferably, the sulfated compound is a compound having an intramolecular sulfonic acid group or a group that is an alkali metallic salt of sulfonic acid. Said molecule can have more than one sulfonic acid group or alkali metallic salt of same.

Even more preferably, the sulfated compound is a compound having the intramolecular structure —S—CH$_2$O—R—SO$_3$—M, or a compound having the intramolecular structure —S—R—SO$_3$—M (where M is hydrogen or an alkali metal, and R is an alkyl group containing 3 to 8 carbons). Even more preferably, the sulfated compound is a compound having one of the following structures (1) to (8):

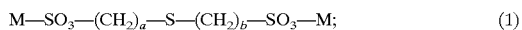  (1)

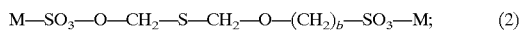  (2)

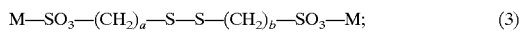  (3)

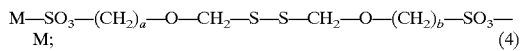  (4)

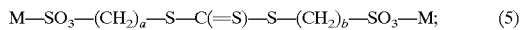  (5)

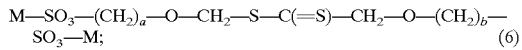  (6)

  (7)

and

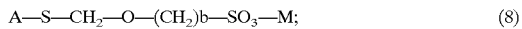  (8)

wherein in the above Formulae (1) through (8), a and b are integers from 3 to 8; M is hydrogen or an alkali metal; and A is hydrogen, an alkyl group with 1 to 10 carbons, an aryl group, a straight-chain or cyclic amine compound comprised of 1 to 6 nitrogens, and 1 to 20 carbons, or a heterocyclic compound comprised of 1 to 2 sulfurs, 1 to 6 nitrogens, and 1 to 20 carbons.

Sulfated compounds are generally used as brighteners, but are included in the scope of this invention even when used for other purposes. When using sulfated compounds, one type alone or a combination of two or more types may be used.

When the sulfated compound is used as a brightener, the concentration of brightener can be, for example, a range of 0.1 to 100 mg/L, and preferably 0.5 to 10 mg/L. Less than 0.1 mg/L concentration in the plating solution has no effect aiding growth of a copper deposit, while greater than 100 mg/L has hardly any improving effect, and therefore is undesirable from the standpoint of economy. The ideal content range of sulfated compounds when used for purposes other than as a brightener can be decided as appropriate by persons skilled in the art.

The present inventors discovered that increasing the degradation product —X—S$^-$ or —Y—S$^-$ produced by cleaving the single bond of the above-mentioned sulfated compound —X—S—Y— inhibits the ability to fill via-holes during electrolytic copper plating and mars the appearance of plating. Therefore, X and Y in the above-mentioned sulfated compound can be replaced. For example, the above-mentioned brightener (1) M—SO$_3$—(CH$_2$)$_a$—S—(CH$_2$)$_b$—SO$_3$—M is considered to produce M—SO$_3$—(CH$_2$)$_a$—S$^-$ or $^-$S—(CH$_2$)$_b$—SO$_3$—M as the degradation product, but either may be —X—S$^-$ or —Y—S$^-$. Therefore, for convenience, degradation products of sulfated compounds are represented as "—X—S$^-$" in this specification.

Moreover, the compound —X—S$^-$ contained in the electrolytic copper plating solution may be a compound having a structure with only the single bond X—S or S—Y in the sulfated compound —X—S—Y— cleaved and no other degraded intramolecular moieties, or said degradation product may be a compound having further degradation of the moiety bonded to X while keeping the structure "—X—S$^-$," or a mixture of several types of these compounds.

Any desired standard method can be used to measure the concentration of compound having the structure "—X—S$^-$," which is a degradation product of a sulfated compound. Examples are methods such as high-speed liquid chromatography, but are not limited to these. When using high-speed liquid chromatography, it may be performed directly on the plating solution, or if there is foreign matter interfering with measurement, said method may be applied after treatment such as removing foreign matter.

When there is only a single —X—S$^-$ compound, the concentration of said single compound corresponds to the concentration of compounds having the structure "—X—S$^-$," and in the case of a mixture of several types of —X—S$^-$ compounds, the sum of concentrations of each compound corresponds to the concentration of compounds having the structure "—X—S$^-$."

Normally, the electrolytic copper plating solution contains counter ions such as metallic ions or hydronium ions with "—X—S$^-$" compounds. Therefore, this invention includes compounds having the structure "—X—S—H," except for specific cases considered to be the active mechanism of "—X—S$^-$" compounds.

In this invention, the monitoring of the concentration of "—X—S$^-$" compounds is used to adjust the amount of electrolysis during dummy electrolysis according to the concentration, and also can be used to adjust the amount of electrolytic copper plating solution circulated in a multi-bath electrolytic copper plating apparatus.

Although not wishing to be bound by theory, it is thought that the principal mechanism producing compounds having the structure "—X—S$^-$" in electrolytic copper plating solutions is that when using a soluble anode such as phosphated copper, for example, the soluble anode reacts with the sulfated compound while electrolysis is stopped, and the single bond of S—X or S—Y in the sulfated compound is cleaved to produce the compound having the structure "—X—S$^-$." It also is thought that the above-mentioned sulfated compound receives electrons from the cathode during electrolytic copper plating, and these cleave the single bond S—X or S—Y in the sulfated compound to produce a compound having the structure "—X—S$^-$." It is thought that electrons released when Cu$^0$ from the soluble anode becomes Cu$^{2+}$ are also received from the anode, causing the sulfated compound to have the structure "—X—S$^-$."

Further not wishing to be bound by theory, it is thought that the active mechanism causing compounds having the structure "—X—S$^-$" to produce negative effects in an electrolytic copper plating solution is that said compound undergoes ion bonding with metallic ions such as $Cu^+$ or $Cu^{2+}$, the plated (or deposited) metal forms clumps due to the presence of this bonded compound, and these clumps produce negative effects such as poor glossiness and mar the appearance of the deposit. It also is considered that when forming filled via-holes, the above-mentioned bonded compound between a degradation product and metallic ions causes inadequate via-filling by reducing the metal plating speed near the bottom of the via-holes to the same level as, or lower than, the metal plating speed at the via-hole openings, or leaves voids and causes problems in filling via-holes due to the shape of the via-holes.

As explained above, the electrolytic copper plating method of this invention has the effects of preventing clumps from forming and marring the appearance of plating, preventing inhibition of via-hole filling, and restoring appearance and via filling. In addition, by preventing clumps from forming, a fine plated copper film is obtained. Again, not wishing to be bound by theory, it is thought that by subjecting the electrolytic copper plating solution supplied to electrolytic copper plating to dummy electrolysis using an insoluble anode in this invention, compounds having the structure "—X—S⁻" produced in the electrolytic copper plating solution due to electrolytic copper plating are drawn toward said insoluble anode and degraded by oxygen produced near the soluble anode to compounds unable to take on the structure "—X—S⁻", or the content of compounds having the structure "—X—S⁻" is reduced by compounds having the structure "—X—S⁻" oxidizing and converting to compounds having the structure "—X'—S—S—Y'" (where X' and Y' are atoms selected independently from a group consisting of carbon, nitrogen, sulfur, and oxygen).

As a result, it is thought that by subjecting the electrolytic copper plating solution supplied to electrolytic copper plating to dummy electrolysis using an insoluble anode in this invention, either no degradation products are produced by cleaving the bond S—X or S—Y in a sulfated compound, or the concentration of such products can be kept within a set range and the bath can be kept in a state capable of providing the desired electrolytic copper plate.

The effects of this invention, however, need not be caused by the mechanisms described above. So long as they have the constitution and offer the effects of this invention, all such cases fall within the scope of this invention even if caused by mechanisms other than those described above or unclear mechanisms. Therefore, for example, cases offering the effects of this invention fall within the scope of this invention even if they do not contain the above-mentioned sulfated compound —X—S—Y—.

In the electrolytic copper plating method of this invention, the concentration of compounds having the structure —X—S⁻ is preferably no more than 2.0 µmol/L from the standpoint of not losing the glossy appearance of the plating, and no more than 1.0 µmol/L, and more preferably no more than 0.5 µmol/L, from the standpoint of assuring plating with a glossy appearance.

In addition, the concentration of compounds having the structure —X—S⁻ is preferably no more than 0.15 µmol/L, and more preferably no more than 0.1 µmol/L, from the standpoint of producing satisfactory via-filling.

An anode comprised of any desired material can be used for the insoluble anode used in this invention, so long as it is a material that does not dissolve metal in to the electrolytic copper plating solutions. Examples of such materials include iridium oxide, platinum-clad titanium, platinum, graphite, ferrite, lead-dioxide-coated titanium and titanium coated with oxides of platinic elements, stainless steel, and lead alloys, but are not limited to these. Preferably, the insoluble anode is iridium oxide, platinum-clad titanium, lead-dioxide-coated titanium, a lead alloy, ferrite, or stainless steel.

Examples of the soluble anode in this invention include phosphated copper and oxygen-free copper, but are not limited to these.

The electrolytic copper plating bath and the main bath and dummy electrolysis bath in a multi-bath electrolytic copper plating apparatus can have any desired number of soluble anodes and/or insoluble anodes installed so long as these do not violate the purpose of this invention, and are not specially limited.

When using a multi-bath electrolytic copper plating apparatus, the ratio of surface area of soluble anodes to insoluble anodes is generally 1:0.01 to 1:100, preferably 1:0.02 to 1:20, more preferably 1:0.02 to 1:1, even more preferably 1:0.02 to 1:0. 1, and most preferably 1:0.02 to 1:0.05. When using a single-bath electrolytic copper plating apparatus, this ratio is generally 1:0.01 to 1:100, preferably 1:0.02 to 1:20, more preferably 1:0.02 to 1:1, even more preferably 1:0.02 to 1:0.1, and most preferably 1:0.02 to 1:0.05. Thus, the electrolytic copper plating method of this invention is advantageous in making it possible to obtain the effects of using insoluble anodes of improving via-filling, improving the appearance of plating, preventing clumps from forming, and forming a fine deposited film while minimizing the surface area of expensive insoluble anodes.

Anodes are preferably coated with an electrolysis membrane or ceramic membrane during dummy electrolysis in the method of this invention. Because doing so minimizes copper deposited on the anodes during dummy electrolysis, this can minimize consumption of copper during dummy electrolysis. So long as it can minimize deposition of copper onto anodes, any desired type of membrane can be used.

Any of direct current, PPR current, or alternating current types can be used as desired for electrolytic copper plating and dummy electrolysis in the method of this invention. The same type of current or different types of currents may be used for the electrolytic copper plating and dummy electrolysis. Likewise, the anode current density may be the same or different. The anode current density applied is set as appropriate according to the type of electrolytic copper plating bath, but in the case of direct current, this is normally 0.1 to 10 $A/dm^2$, and preferably 1 to 3 $A/dm^2$. Less than 0.1 $A/dm^2$ increases the anode surface and is uneconomical, while greater than 10 $A/dm^2$ is undesirable because it increases the amount of oxidation degradation of ingredients in the electrolytic copper plating solution by producing oxygen from the anodes during electrolysis.

In this invention, "PPR current" means current in which the direction of current has a pulse waveform that varies cyclically, such as short cycles of forward electrolysis (electrolytic plating) and reverse electrolysis. The current cycle can be set as desired, but preferably, the forward electrolysis time is longer than the reverse electrolysis time. For example, forward electrolysis time is 1 to 50 msec and preferably 10 to 20 msec, and reverse electrolysis time is 0.2 to 5 msec and preferably 0.5 to 1 msec. Less than 1 msec forward electrolysis time is undesirable because electrolysis stops before normal deposition of copper plating starts, and greater than 50 msec forward electrolysis time does not allow a slower plating speed of copper deposition near the sealed end face of blind via-holes than the plating speed near the opening. Less than 0.2 msec reverse electrolysis time does not allow a slower plating speed of copper deposition near the sealed end face of blind via-holes than the plating speed near the opening, and greater than 5 msec reverse electrolysis time, by causing the copper film already deposited to dissolve, increases the time required to fill blind via-holes and is counterproductive. Furthermore, the PPR current described above may also have a rest time between forward electrolysis and reverse electrolysis during which no current flows.

The forward electrolysis current density when using PPR current is normally 0.1 to 20 $A/dm^2$, and preferably 0.5 to 5 $A/dm^2$. The reverse electrolysis current density is normally 0.1 to 200 $A/dm^2$, and preferably 1 to 25 A/dm. The ratio of current density during electrolysis is normally 1 to 10, and preferably 2 to 5 reverse electrolysis to 1 forward electrolysis. A ratio of current density during electrolysis lower than 1 reverse electrolysis to 1 forward electrolysis makes it difficult to make the plating speed of copper deposition near the sealed end face of blind via-holes slower than the plating speed near the opening because adsorbed sulfated compound near the opening of blind via-holes cannot be adequately desorbed, and a ratio of current density during electrolysis greater than 10 reverse electrolysis to 1 forward electrolysis tends to increase the time required to fill blind via-holes by causing the copper film already deposited to dissolve.

In this invention, "alternating current types" means using both direct current and alternating current, where alternating current corresponds to reverse electrolysis in the above-mentioned PPR current. During alternating current, the reverse electrolysis time in the above-mentioned PPR current is generally set at 1 to 100 cycles, and preferably 50 to 60 cycles. Other conditions of alternating current types are the same as for the PPR current described above.

So long as it is a standard composition used in electrolytic copper plating solutions, any composition can be used for the basic composition of the electrolytic copper plating solution of this invention without special restrictions, and so long as the purpose of this invention is achieved. The basic composition can be changed as appropriate, such as changing concentrations or adding additives. For example, in the case of copper sulfate plating solutions, the solution is an aqueous solution containing sulfuric acid, copper sulfate, and a water-soluble chlorine compound as basic ingredients, and said plating solution basic composition can be used without special restrictions so long as it is a basic composition used in standard copper sulfate plating.

The concentration of sulfuric acid in copper sulfate plating solutions is normally 30 to 400 g/L, and preferably 170 to 210 g/L. For example, less than 30 g/L sulfuric acid concentration reduces the conductivity of the plating bath, making charging the plating bath difficult, and greater than 400 g/L concentration hinders copper sulfate from dissolving in the plating bath and leads to precipitation of copper sulfate.

The concentration of copper sulfate in copper sulfate plating solutions is normally 20 to 250 g/L, and preferably 60 to 180 g/L. For example, less than 20 g/L copper sulfate concentration provides an inadequate supply of copper ions to the substrate to be plated, making it impossible to plate a normal deposit, and greater than 250 g/L concentration makes dissolving difficult.

So long as it is used in standard copper sulfate plating solutions, any desired compound can be used for the water-soluble chlorine compound contained in copper sulfate plating solutions. Examples of said water-soluble chlorine compound include hydrochloric acid, sodium chloride, potassium chloride, and ammonium chloride, but are not limited to these. One type of water-soluble chlorine compound may be used, or a mixture of two or more types may be used.

The concentration of said water-soluble chlorine compound contained in copper sulfate plating solutions in this invention is normally 10 to 200 mg/L, and preferably 30 to 80 mg/L, as concentration of chloride ions. For example, less than 10 mg/L chloride ion concentration hinders normal action by additives such as brighteners and surface active agents, and greater than 200 mg/L concentration is undesirable because it produces large production of chlorine gas from the anode.

The plating solution used in this invention can contain a surface active agent if desired. Any desired standard surface active agent normally used as an additive in electrolytic copper plating solutions can be used. Preferred examples of surface active agents are compounds having the following structures (9) to (13), but are not limited to these:

(where a=an integer from 5 to 500);

(where a=an integer from 5 to 200);

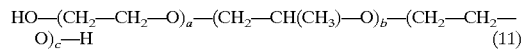

(where a and c are integers, and a+c=an integer from 5 to 250, and b=an integer from 1 to 100);

(where n=an integer from 5 to 500); and

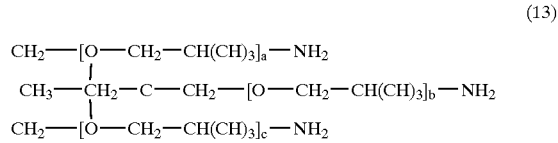

(where a, b, and c are integers from 5 to 200)

The surface active agent used in this invention may be one type or a mixture of two or more types. The content of surface active agents used in this invention can be, for example, a range of 0.05 to 10 g/L, and preferably 0.1 to 5 µL. Less than 0.05 µL concentration in plating solution produces many pin-holes in the plating film due to inadequate wetting effect, making it difficult to deposit a normal plating film, while greater than 10 g/L concentration has hardly any matching improvement in effect, and therefore is undesirable from the standpoint of economy.

So long as it can endure the conditions of the method of this invention and forms a metallic layer by plating, any desired material can be used for the substrate subjected to electrolytic copper plating by the method of this invention. Examples of materials include resins, ceramics, and metals, but are not limited to these. Examples of substrates comprised of resin are printed circuit boards, and examples of substrates comprised of ceramics are semiconductor wafers, but are not limited to these. Examples of metals include silicon, but are not limited to these. Examples of substrates comprised of metal are silicon wafers, but are not limited to these. Because the method of this invention is especially superior for filling via-holes, the substrate supplied to this invention is preferably a substrate having holes such as through-holes or via-holes, and more preferably, a printed circuit board or wafer having through-holes and/or via-holes.

Examples of resins used in substrates are thermoplastic resins and epoxy resins, including but not limited to polyolefin resins, including polyethylene resins such as high-density polyethylene, medium-density polyethylene, branching low-density polyethylene, straight-chain low-density polyethylene, or supermacromolecular polyethylene, polypropylene resins, polybutadiene, polybutene resins, polybutylene resins, and polystyrene resins; halogenated resins such as polyvinyl chloride resins, polyvinylidene chloride resins, polyvinylidene chloride-vinyl chloride copolymer resins, chlorinated polyethylene, chlorinated polypropylene, or tetrafluoroethylene; AS resins; ABS resins; MBS resins; polyvinyl alcohol resins; polyacrylic ester resins such as poly (methyl acrylate); polymethacrylic ester resins such as poly (methyl methacrylate); methyl methacrylate-styrene copolymer resins; maleic anhydride-styrene copolymer resins; vinyl polyacetate resins; cellulose resins such as cellulose propionate resins or cellulose acetate resins; epoxy resins; polyamide resins such as Nylons; polyamide imide resins; polyallylate resins; polyether imide resins; polyether ether ketone resins; polyethylene oxide resins; various types of polyester resins such as PET resins; polycarbonate resins; polysulfone resins; polyvinyl ether resins; polyvinyl butyral resins; polyphenylene ether resins such as polyphenylene oxides; polyphenylene sulfide resins; polybutylene terephthalate resins; polymethylpentene resins; polyacetal resins; vinyl chloride-vinyl acetate copolymer; ethylene-vinyl chloride copolymer; ethylene-vinyl chloride copolymer; and blends with these copolymers; and thermosetting resins, including but not limited to xylene resins; guanamine resins; diallyl phthalate resins; vinyl ester resins; phenolic resins; unsaturated polyester resins; furan resins; polyimide resins; polyurethane resins; maleic acid resins; melamine resins; urea resins; and mixtures of these. Preferred resins are epoxy resins, polyimide resins, vinyl resins, phenolic resins, Nylon resins, polyphenylene ether resins, polypropylene resins, fluorinated resins, and ABS resins. More preferred resins are epoxy resins, polyimide resins, polyphenylene ether resins, fluorinated resins, and ABS resins. Even more preferred resins are epoxy resins and polyimide resins. Resin substrates may be comprised of a single resin or several resins. Resins also may be coated or laminated on top of other substrates to form a composite. Furthermore, resin substrates that can be used in this invention are not limited to resin-molded products, but may be a composite of resins having a reinforcing material such as fiberglass-reinforced material in between, or a resin film coated onto bases comprised of various types of raw materials, including ceramics, glass, or metals such as silicon.

Examples of ceramics that can be used as substrate materials include oxide ceramics, such as alumina ($Al_2O_3$), steatite ($MgO \cdot SiO_2$), forsterite ($2MgO \cdot SiO_2$), malite ($3Al_2O_3 \cdot 2SiO_2$), magnesia (MgO), spinel ($MgO \cdot Al_2O_3$), and beryllia (BeO); nonoxide ceramics such as aluminum nitride or silicon carbide; and low-temperature sintered ceramics, such as glass ceramics; but are not limited to these.

The part of the substrate to be plated by the method of this invention is subjected to conductivity treatment before electrolytic copper plating. For example, when filling vias with metallic copper by electrolytic copper plating by the method of this invention, first, the inner wall of the via is made conductive. Any desired standard conductivity method can be used for this conductivity treatment. Examples of conductivity methods include a variety of methods such as electroless copper plating, direct plating, conductive grain adhesion, or gas-phase plating, but are not limited to these.

The plating temperature of the electrolytic copper plating bath of the present method is set as appropriate according to the type of plating bath, but is normally 10° C. to 40° C., and preferably 20° C. to 30° C. Lower than 10° C. plating temperature reduces plating solution conductivity, which makes it impossible to raise current density during electrolysis, retards the growth speed of the deposit, and reduces productivity, while greater than 40° C. plating temperature is undesirable because of the risk of degrading brighteners.

There is no objection to agitating during electrolytic copper plating by the method of this invention, and agitating is desirable to equalize the supply of copper ions and additives to the surface to be plated. Air agitation or jet spraying can be used as the agitation method. Agitating using air is preferred from the standpoint of increasing dissolved oxygen in the plating solution. Even when agitating by jet spray, agitating using air can also be used. Furthermore, open switching filtration or circulating filtration can also be performed, and subjecting the plating solution to circulating filtration by a filter device is preferred. This can equalize the temperature of the plating solution and also remove impurities such as dirt or sediment in the plating solution.

Plating a substrate by the method of this invention produces a composite material having a copper layer on top of the substrate. Electrolytic copper plating by the method of this invention does not cause clumps in the copper layer of the composite material obtained when electrolytic copper plating is applied later using an electrolytic copper plating solution, and achieves via-filling with no voids when used for filling via-holes.

In addition, the method of this invention can be applied to either vertical or horizontal plating equipment.

This invention is explained in detail by the following working examples, but said working examples are not to be taken as limiting the scope of this invention. In each of the Figures referred to in the examples, 1 is a conductive circuit, 2 is a dielectric and 3 is a copper deposit.

EXAMPLE 1

Dummy Electrolysis Using a Single Bath and Direct Current

Electrolytic copper plating solutions were prepared by dissolving the following chemicals in distilled water: 200 g/L copper sulfate pentahydrate, 100 g/L sulfuric acid, 50 mg/L chloride, 1.5 mg/L bis(3-sulfopropyl)disulfide disodium (SPS), 1500 mg/L cationic surface active agent, 375 mg/L nonionic surface active agent, and 1000 $\mu$g/L (5.6 $\mu$mol/L) 3-mercapto-1-propanesulfonic sodium salt (MPS, manufactured by Tokyo Kasei). MPS is considered a degradation product of SPS by electrolytic copper plating. Adding MPS stimulates deterioration of the electrolytic copper plating solution.

1.5 L of the electrolytic copper plating solution described above were placed in a Haring cell, and said electrolytic copper plating solution was subjected to dummy electrolysis using a soluble anode or an insoluble anode. Conditions of dummy electrolysis were 23° C. plating bath temperature, 2 A/dm$^2$ (2 A) current density, and an anode area of 1.33 dm$^2$ per liter of solution. In the soluble anode case, a phosphated copper anode was used and dummy electrolysis was performed for 60 min. In the insoluble anode case, a Pt/Ti mesh was used and dummy electrolysis was performed for 5 to 20 min. As a control group, a solution was prepared without subjecting it to dummy electrolysis.

After dummy electrolysis, copper was electrolytically deposited on substrates to produce an accumulation thickness of 25 μm using electrolytic copper plating solutions treated as described above. Evaluation substrates having micro via-holes 120 μm in diameter and 50 μm deep were used for the substrates, and a phosphated copper soluble anode was used as the anode. Conditions of electrolytic copper plating were a Haring cell, 1.5 L electrolytic copper plating bath, 23° C. plating bath temperature, 2 A/dm$^2$ (2 A) current density, and an anode area of 1.33 dm$^2$ per liter of solution.

After electrolytic copper plating, evaluation substrates were evaluated for via-filling. FIG. 1 shows cross-section photographs of via-holes after electrolytic copper plating using electrolytic copper plating solutions treated by dummy electrolysis. As a result, when not subjected to dummy electrolysis (0 minutes dummy electrolysis), via-filling was inadequate. When subjected to dummy electrolysis by a soluble anode for 60 minutes, the deposited copper film increased somewhat in thickness, but not enough to completely fill via-holes.

When subjected to dummy electrolysis by an insoluble anode, dummy electrolysis for 5 minutes showed no improvement in via-filling, but with 10 minutes treatment, copper film increased somewhat in thickness, and with 15 and 20 minutes treatment, via-holes were completely filled.

From these findings, it is clear that dummy electrolysis corrected reduction in via-holes filling.

EXAMPLE 2

Dummy Electrolysis Using a Single Bath and PPR Current

Effect of MPS on Via-holes Filling Under PPR Current Conditions

Electrolytic copper plating solutions were prepared by dissolving the following chemicals in distilled water: 130 g/L copper sulfate pentahydrate, 190 g/L sulfuric acid, 60 mg/L chloride, 4 mg/L SPS, and 500 mg/L nonionic surface active agent. 3-Mercapto-1-propanesulfonic sodium salt (MPS, manufactured by Tokyo Kasei) was added to said electrolytic copper plating solutions to a concentration of 10 to 1000 μg/L (0.056 to 5.6 μmol/L). As a control group, a solution was prepared without adding MPS.

1.5 L of the electrolytic copper plating solutions described above were placed in Haring cells, and electrolytic copper plating was applied to substrates. Evaluation substrates having micro via-holes 155 μm in diameter and 55 μm deep were used for the substrates, and a phosphated copper soluble anode was used as the anode. Conditions of electrolytic copper plating were a Haring cell, 1.5 L electrolytic copper plating bath, 20° C. plating bath temperature, 2 A/dm$^2$ current density, ratio of forward/reverse ("F/R") current density=1/1, ratio of F/R time=10/0.5 msec, and 60 minutes plating time.

Figure 2:
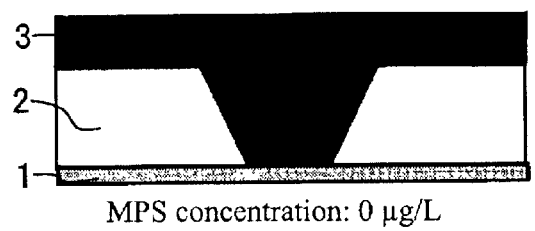
FIG. 2 are microscope section photographs of via-holes after electrolytic copper plating by PPR current, showing reduction of via-filling due to MPS.
Figure 2:
Figure 2:
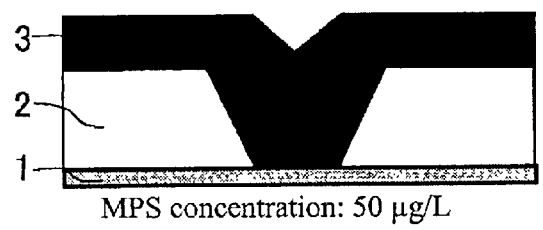
Figure 2:
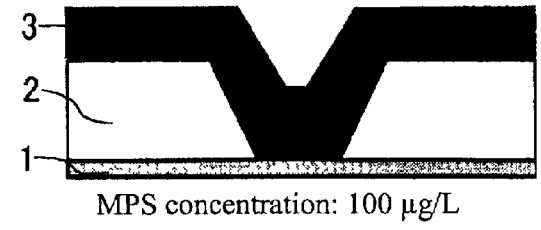
Figure 2:
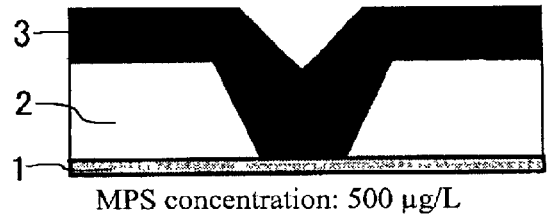
Figure 2:
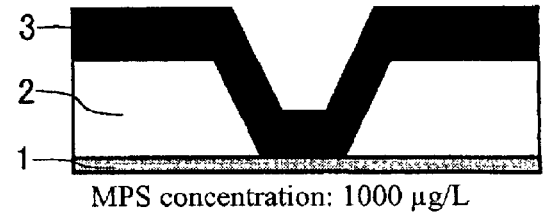

After electrolytic copper plating, evaluation substrates were evaluated for via-filling. FIG. 2 shows cross-section photographs of via-holes after electrolytic copper plating using electrolytic copper plating solutions with different MPS concentrations. As a result, when the solution contained no MPS (0 μg/L), via-holes filled completely. When solutions contained MPS at a concentration of 10 to 1000 μg/L, via-filling was reduced as the concentration increased. As a result of visually observing the appearance of the copper film after electrolytic copper plating, the appearance of plating was glossy at MPS concentrations up to 100 μg/L, but became semi-glossy at concentrations of 500 μg/L and 1000 μg/L. Moreover, the appearance was glossier at 500 μg/L than at 1000 μg/L.

Dummy Electrolysis

Before applying electrolytic copper plating under the above-mentioned conditions using the electrolytic copper plating solution containing 1000 μg/L MPS described above, said electrolytic copper plating solution containing MPS was subjected to dummy electrolysis using an insoluble anode or a soluble anode. A phosphated copper anode was used as the soluble anode, and a Pt/Ti mesh was used as the insoluble anode. Conditions of dummy electrolysis were the same as the conditions for electrolytic copper plating described above except for the type of anode used and the amount of electrolysis. As a control group, electrolytic copper plating was performed using an electrolytic copper plating solution not containing MPS immediately after setting up the bath, and electrolytic copper plating was performed using the electrolytic copper plating solution containing 1000 μg/L MPS described above without subjecting to dummy electrolysis. Moreover, all electrolytic copper plating was performed by a soluble anode.

Figure 3:
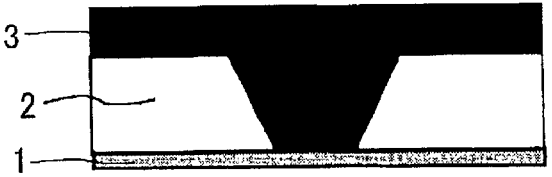
FIG. 3 are microscope section photographs of via-holes after electrolytic copper plating, showing restoration of via-filling by dummy electrolysis using PPR current.
Figure 3:
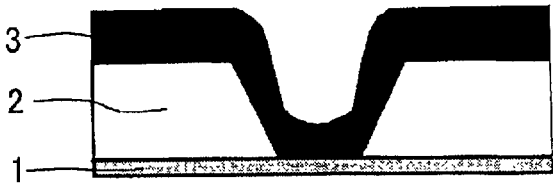
Figure 3:
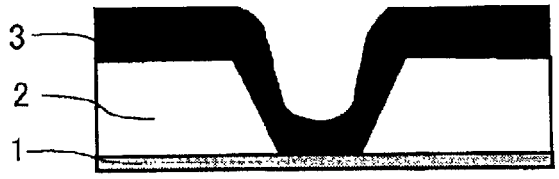
Figure 3:
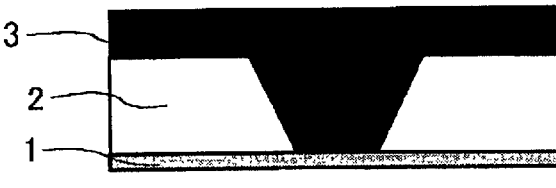
Figure 3:
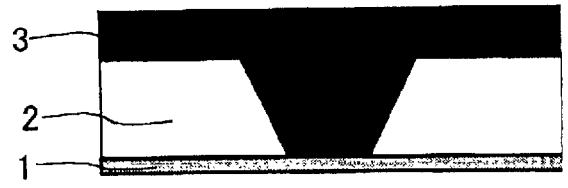

After electrolytic copper plating, evaluation substrates were evaluated for via-filling. FIG. 3 shows cross-section photographs of via-holes after electrolytic copper plating under various conditions. As a result, when an electrolytic copper plating solution containing no MPS was used immediately after setting up the bath (No. 1), via-holes were filled without subjecting to dummy electrolysis and the appearance of plating was glossy. When plated by an electrolytic copper plating solution containing 1000 μg/L MPS (No. 2), via-filling was incomplete and the appearance of plating was semi-glossy.

When subjected to dummy electrolysis by an electrolytic copper plating solution containing 1000 μg/L MPS using a soluble anode, via-filling was incomplete and the appearance of plating was semi-glossy when the amount of electrolysis was 1.33 Ahr/L (No. 3), but via-holes were filled and the appearance of plating was glossy when the amount of electrolysis was 2.7 Ahr/L (No. 4).

When subjected to dummy electrolysis by an electrolytic copper plating solution containing 1000 μg/L MPS using an insoluble anode (No. 5), via-holes were filled and the appearance of plating was glossy when the amount of electrolysis was 0.22 Ahr/L.

From the above findings, it is clear that by subjecting an electrolytic copper plating solution having reduced filling ability and plating appearance to dummy electrolysis before electrolytic copper plating, via-filling ability and plating appearance were restored regardless of whether a soluble anode or an insoluble anode was used for said dummy electrolysis. The amount of electrolysis required during dummy electrolysis to restore via-filling and plating appearance was 2.7 Ahr/L using a soluble anode and 0.22 Ahr/L using an insoluble anode. From this, it is clear that dummy electrolysis by an insoluble anode is markedly more effective than dummy electrolysis by a soluble anode for correcting reduced via-filling ability and plating appearance.

EXAMPLE 3

Using a Multi-Bath Electrolytic Copper Plating Apparatus

An electrolytic copper plating solution was prepared by dissolving the following chemicals in distilled water: 200 g/L copper sulfate pentahydrate, 100 g/L sulfuric acid, 50 mg/L chloride, 1.5 mg/L bis(3-sulfopropyl)disulfide disodium (SPS), 1500 mg/L cationic surface active agent, and 375 mg/L nonionic surface active agent. In addition, direct current was used.

First, the electrolytic copper plating solution was subjected to degradation treatment using an electrolytic copper plating apparatus comprised of one main bath and one dummy electrolysis bath. Said "degradation treatment" refers to performing electrolytic copper plating in the main bath and dummy electrolysis in the dummy electrolysis bath while circulating electrolytic copper plating solution between the main bath and the dummy electrolysis bath in a multi-bath electrolytic copper plating apparatus, and was performed by operating a standard multi-bath electrolytic copper plating apparatus normally. The main bath had a bath volume of 4 L and the dummy electrolysis bath had a bath volume of 0.5 L, for a total of 4.5 L electrolytic copper plating solution used. The circulation speed of electrolytic copper plating solution between the main bath and the dummy electrolysis bath was 0.7 to 0.9 L/min. Air agitation was performed in both baths. Electrolytic copper plating was performed using a phosphated copper anode as the anode at 23° C. plating bath temperature, 2 A/dm² (6 A) current density, and an anode area of 1.33 dm² per liter of solution. Dummy electrolysis was performed using $IrO_2$ as the anode at 23° C. plating bath temperature, 2 A/dm² (0.3 A) current density, and 0.07 dm²/L anode area. Electrolytic copper plating and dummy electrolysis were stopped at the point when the amount of electrolysis during electrolytic copper plating was 0, 30, 50, or 100 Ahr/L. Moreover, as a control group, said degradation treatment was performed without subjecting to dummy electrolysis in the dummy electrolysis bath.

To investigate the degree of degradation of the electrolytic copper plating solution during the degradation treatment described above, electrolytic copper plating was performed on a new evaluation substrate using electrolytic copper plating solution after the degradation treatment described above. The evaluation substrate was the same as used in Example 1. Electrolytic copper plating was performed for an electrolysis amount of 50 Ahr/L under the same degradation treatment conditions as given above except for not subjecting to dummy electrolysis in the dummy electrolysis bath. After completing electrolytic copper plating, the evaluation substrate was evaluated for via-filling and plating appearance.

Figure 4:
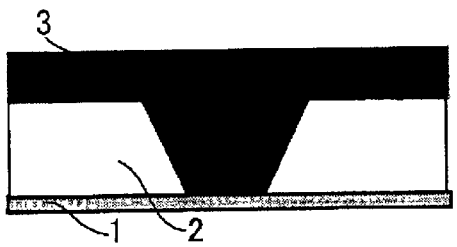
FIG. 4 are microscope section photographs of via-holes after electrolytic copper plating, showing maintenance of via-filling by dummy electrolysis when using a multi-bath electrolytic copper plating apparatus.
Figure 4:
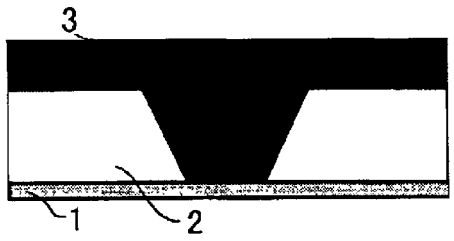
Figure 4:
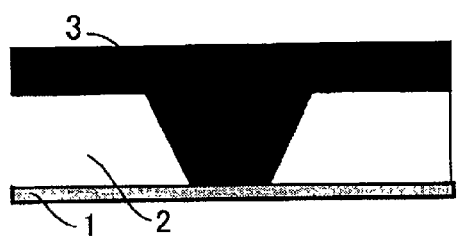
Figure 4:
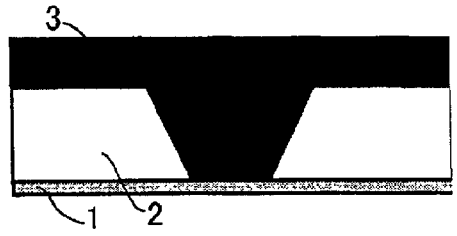
Figure 4:
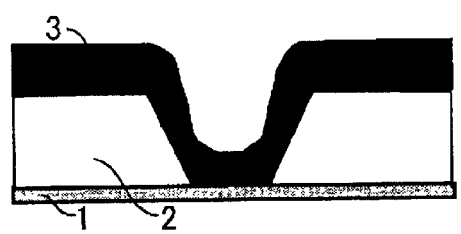
Figure 4:
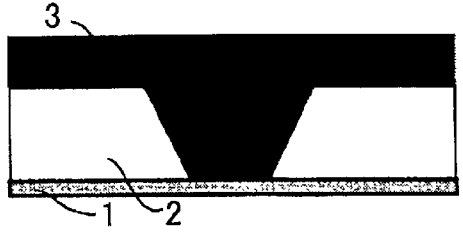
Figure 4:
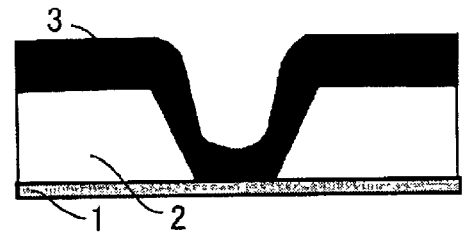
Figure 4:
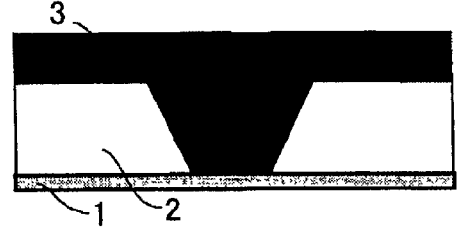

FIG. 4 shows cross-section photographs of via-holes after plating. It was found that when the amount of electrolysis during degradation treatment was 50 Ahr/L or greater and dummy electrolysis was not performed, via-filling was reduced. By contrast, no reduction in filling was found, regardless of the amount of electrolysis, when dummy electrolysis was applied together with electrolytic copper plating during degradation treatment.

From this, it is clear that performing dummy electrolysis simultaneously with electrolytic copper plating in a multi-bath electrolytic copper plating apparatus can prevent degradation of the electrolytic copper plating solution.

As explained above, by subjecting electrolytic copper plating solution to dummy electrolysis using an insoluble anode, this invention can maintain and restore via-filling ability, fineness of deposited copper films, and plating appearance when these properties of the electrolytic copper plating solution have become degraded. In addition, when the electrolytic copper plating solution contains sulfated compounds, by subjecting this to dummy electrolysis using an insoluble anode, this invention can reduce the concentration of compounds having the structure "—X—S—Y—," which is a degradation product of the above-mentioned sulfated compounds, and can maintain and restore via-filling ability, copper film fineness, and plating appearance.

Furthermore, by applying dummy electrolysis simultaneously with electrolytic copper plating using a multi-bath electrolytic copper plating apparatus, this invention has the advantages that it does not require a separate treatment to restore the electrolytic copper plating bath, and can save time and effort.

Moreover, because soluble anodes can be used for electrolytic copper plating, the electrolytic copper plating method of this invention can decrease the surface area of insoluble anodes used compared to using insoluble anodes for electrolytic copper plating itself. As a result, this invention can decrease the amount of expensive insoluble anodes used, and can reduce overall system costs. Because soluble anodes can be used for electrolytic copper plating, this invention can also reduce the amount of copper salts replenished during plating, and can prevent impurities contained in copper salts being added by this replenishing.

What is claimed is:

1. A method for plating copper comprising the steps of: contacting a substrate to be plated with a copper plating bath comprising a soluble anode and an acid copper electroplating solution which comprises a compound having the structure —X—S—Y—, where X and Y are atoms selected independently from the group consisting of hydrogen, carbon, sulfur, and nitrogen, and wherein X and Y can be the same only when both are carbon, applying a current density to the copper electroplating solution to deposit copper on the substrate, and subjecting the copper electroplating solution to dummy electrolysis using an insoluble anode to maintain a compound of the formula —X—S⁻ or —Y—S⁻ in an amount of no more than 2.0 µmol/L.

2. The method of claim 1, wherein the soluble anode is replaced with the insoluble anode after copper deposition; and then subjecting the copper electroplating solution to the dummy electrolysis using the insoluble anode.

3. The method of claim 1 wherein the copper plating bath further comprises the insoluble anode.

4. The method of claim 1, wherein the compound having the structure —X—S—Y— is a compound chosen from:

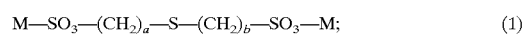

(1)

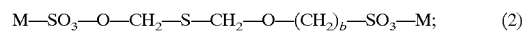

(2)

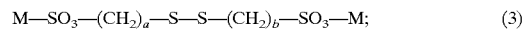

(3)

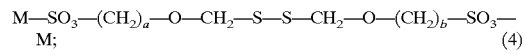

(4)

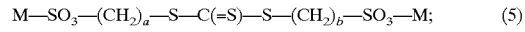

(5)

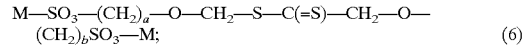

(6)

(7)

or

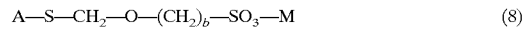

(8)

wherein a and b are integers from 3 to 8; M is hydrogen or an alkali metal; and A is hydrogen, an alkyl group with 1 to 10 carbons, an aryl group, a straight-chain or cyclic amine compound comprised of 1 to 6 nitrogens and 1 to 20 carbons, or a heterocyclic compound comprised of 1 to 2 sulfurs, 1 to 6 nitrogens, and 1 to 20 carbons.

5. The method of claim 1, wherein the amount of the compound having the structure —X—S—Y— in the copper electroplating solution is 0.1 to 100 mg/L.

6. The method of claim 1, wherein the soluble anode and the insoluble anode have a ratio of surface areas of 1:100 to 100:1.

7. The method of claim 1, wherein the insoluble anode is chosen from iridium oxide, platinum-clad titanium, lead-dioxide-coated titanium lead alloys, ferrite or stainless steel.

8. The method of claim 1, wherein the substrate comprises a through-hole or via-hole.

9. The method of claim 1, wherein the current density is applied using direct current, PPR current, or alternating current types.

10. A method for plating copper comprising the steps of: providing a multi-bath copper electroplating apparatus comprising a main bath having a soluble anode, a dummy electrolysis bath having an insoluble anode, and a circulation pipe connecting the main bath and the dummy electrolysis bath, the circulation pipe allowing fluid communication between the main bath and the dummy electrolysis bath; providing a copper electroplating solution comprising a compound having the structure —X—S—Y—, where X and Y are atoms selected independently from the group consisting of hydrogen, carbon, sulfur, and nitrogen, and wherein X and Y can be the same only when both are carbon to the main bath and the dummy electrolysis bath; contacting a substrate to be plated with the copper electroplating solution in the main bath; applying a current density to the soluble anode to deposit copper on the substrate; applying a current density to the insoluble anode to maintain a compound of the formula —X—S$^-$ or —Y—S$^-$ in an amount of no more than 2.0 $\mu$mol/L.

* * * * *